(12) United States Patent
Kawata

(10) Patent No.: US 7,081,691 B2
(45) Date of Patent: Jul. 25, 2006

(54) SWITCHING DEVICE FOR CONTROLLING LARGE AMOUNT OF CURRENT

(75) Inventor: Hiroyuki Kawata, Chiryu (JP)

(73) Assignee: Denso Corporation, Kariya (JP)

( * ) Notice: Subject to any disclaimer, the term of this patent is extended or adjusted under 35 U.S.C. 154(b) by 440 days.

(21) Appl. No.: 10/396,399

(22) Filed: Mar. 26, 2003

(65) Prior Publication Data

US 2003/0206392 A1  Nov. 6, 2003

(30) Foreign Application Priority Data

Apr. 17, 2002   (JP)  .............................. 2002-115252

(51) Int. Cl.
*H05K 7/20*  (2006.01)
(52) U.S. Cl. ......................... 307/9.1; 361/704; 361/714
(58) Field of Classification Search ................... 337/20; 361/704, 714; 307/9.1
See application file for complete search history.

(56) References Cited

U.S. PATENT DOCUMENTS

| | | | | |
|---|---|---|---|---|
| 4,047,242 A | * | 9/1977 | Jakob et al. ................. | 361/714 |
| 4,344,106 A | * | 8/1982 | West et al. .................. | 361/717 |
| 5,172,756 A | * | 12/1992 | Jayamanne et al. ........ | 165/80.3 |
| 5,777,850 A | * | 7/1998 | Jakob et al. ................. | 361/736 |
| 6,078,155 A | * | 6/2000 | Tominaga et al. .......... | 318/293 |

* cited by examiner

*Primary Examiner*—Brian Sircus
*Assistant Examiner*—Andrew Deschere
(74) *Attorney, Agent, or Firm*—Posz Law Group, PLC

(57) ABSTRACT

A switching device for controlling a large amount of current includes a circuit board carrying electronic components thereon, a power-switching element electrically connected to the circuit board, and a housing disposed underneath the circuit board and containing the power-switching element therein. The housing made of a heat-conductive material includes a heat-sink block having a sloped surface on which the power-switching element is mounted. Connecting leads extending from the power-switching element are positioned at an upper portion of the sloped surface which is close to the circuit board. In this manner, the length of connecting leads is shortened and heat and noises generated therein are suppressed.

7 Claims, 6 Drawing Sheets

SWITCHING DEVICE FOR CONTROLLING LARGE AMOUNT OF CURRENT

CROSS-REFERENCE TO RELATED APPLICATION

This application is based upon and claims benefit of priority of Japanese Patent Application No. 2002-115252 filed on Apr. 17, 2002, the content of which is incorporated herein by reference.

BACKGROUND OF THE INVENTION

1. Field of the Invention

The present invention relates to a switching device that controls a large amount of current, the switching device including a power-switching element such as a switching transistor, and more particularly to such a switching device used for controlling operation of a motor-assisted steering device.

2. Description of Related Art

An example of a conventional power-switching device is shown in FIG. 7. A switching element 131, such as a power-MOS-FET or an IGBT, is mounted on a heat-sink block 181 having a flat mounting surface 182. A connecting lead 131b led out from the switching element 131 is electrically connected to a printed circuit board 161 by soldering. Heat generated in the switching element 131 is dissipated through the heat-sink block 181. Another example of this kind of power-switching device is disclosed in JP-A-2000-203437. This power-switching device is used in a circuit for controlling a motor-assisted steering device for an automotive vehicle. A semiconductor switching element is mounted on a surface of a metallic substrate connected to a heat-sink.

In the conventional switching device shown in FIG. 7, a large amount of current, e.g., 40–80 amperes, flows through the connecting lead 131b. The switching element 131 is mounted on the flat mounting surface 182 that is parallel to the printed circuit board 161, and a space for clearing a thickness of the switching element 131 and a height of a mounting screw has to be provided between the flat mounting surface 182 and the printed circuit board 161. Therefore, the connecting lead 131b has to be long enough to cover the space. Accordingly, heat is generated in the connecting lead 131b by a large amount of current flowing therethrough. Especially, the heat is generated in a portion of the connecting lead 131b having a small cross-sectional area.

In the power-switching device disclosed in JP-A2000-203437, a power-switching element is mounted on a metallic substrate and other electronic components are mounted on another circuit substrate. Therefore, two substrates are required and both substrates have to be electrically connected to each other. Accordingly, the structure of the power-switching device becomes complex and its manufacturing cost becomes high. Further, though the metallic substrate has a high heat-dissipation ability, only a single layer circuit can be printed on the metallic substrate, and therefore it is unavoidable that a circuit impedance becomes high, accompanied by generation of higher noises.

SUMMARY OF THE INVENTION

The present invention has been made in view of the above-mentioned problems, and an object of the present invention is to provide an improved power-switching device, in which a temperature rise in connecting leads of a switching element is suppressed and an impedance therein is lowered. Another object of the present invention is to provide such a power-switching device suitable for a circuit controlling a motor-assisted steering system.

The switching device of the present invention includes a circuit board on which various electronic components are mounted, a power-switching element such as a switching transistor electrically connected to the circuit board, and a housing containing the power-switching element therein and disposed underneath the circuit board. The switching device controls and switches a large amount of current, e.g., 40–80 amperes. The housing made of heat-conductive material such as aluminum includes a heat-sink block having a sufficient heat-capacity. The heat-sink block includes at least one sloped mounting surface on which the power-switching element is mounted. The sloped mounting surface rises up from a bottom plate of the housing toward the circuit board.

The switching element including connecting leads extending from one side thereof is mounted on the sloped mounting surface, so that the connecting leads are positioned at an upper portion of the sloped mounting surface and close to the circuit board. An insulation sheet is interposed between the sloped mounting surface and the switching element. The connecting leads are bent upwardly and directly connected to the circuit board by soldering. In this manner, the length of the connecting leads is shortened, and its electric resistance and impedance is lowered. Therefore, heat generated in the connecting leads is suppressed and noises generated therein are also suppressed.

A step, against which a lower fringe of the insulation sheet abuts, may be formed on the sloped mounting surface to easily position the insulation sheet on the sloped mounting surface. The heat-sink block may be formed to includes a pair of sloped mounting surfaces to mount plural switching elements thereon. In this case, the connecting leads of the switching elements mounted on one surface face the connecting leads of the switching elements mounted on the other surface. Preferably, drain leads (or source leads) of the switching elements mounted on one surface are aligned in line with source leads (or drain leads) of the switching elements mounted on the other surface. In this manner, the length of the leads connecting the drains and sources is further shortened to further reduce heat generated in the connecting leads. The switching device of the present invention is suitably used in a motor-assisted steering device of an automotive vehicle.

According to the present invention, heat generated in the leads connecting the power-switching element to the circuit board is suppressed, and noises in the connecting circuit are also suppressed, while sufficiently dissipating heat generated in the power-switching element through the heat-sink block.

Other objects and features of the present invention will become more readily apparent from a better understanding of the preferred embodiment described below with reference to the following drawings.

DETAILED DESCRIPTION OF THE PREFERRED EMBODIMENT

Figure 1:
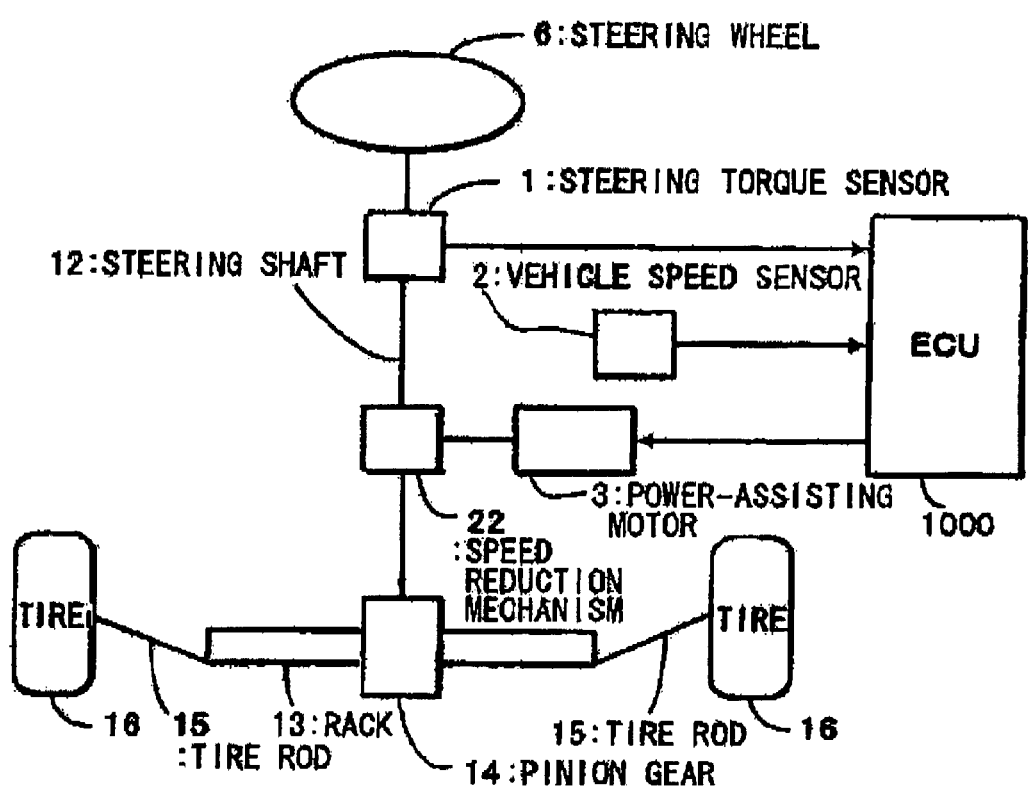
FIG. 1 is a block diagram showing an entire structure of a motor-assisted steering system for use in an automotive vehicle.

A preferred embodiment of the present invention will be described with reference to FIGS. 1–4B. FIG. 1 shows an entire structure of a motor-assisted steering system, in which a switching device according to the present invention is used. The switching device is included in an electronic control unit (referred to as an ECU) 1000. A steering shaft 12 is connected to a steering wheel 6 that is driven by a driver. A pinion gear 14 that engages with a rack 13 is connected to the steering shaft 12. A pair of tires 16 is connected to the rack 13 through a pair of tie-rods 15. Thus, the pair of tires 16 is steered in response to rotation of the steering wheel 6.

A steering torque sensor 1 is coupled to the steering shaft 12, and the steering torque sensor 1 outputs electrical signals representing a steering torque generated by rotating the steering wheel 6. A power-assisting motor 3 (a direct current motor) is connected to the steering shaft 12 through a speed reduction mechanism 22. The speed reduction mechanism 22 is a known type composed of a worm and a worm wheel. The ECU 1000 drives the power-assisting motor 3 in a controlled manner according to signals fed from the steering torque sensor 1 a vehicle speed sensor 2. The power-assisting motor 3 assists a steering torque generated by the driver.

Figure 2:
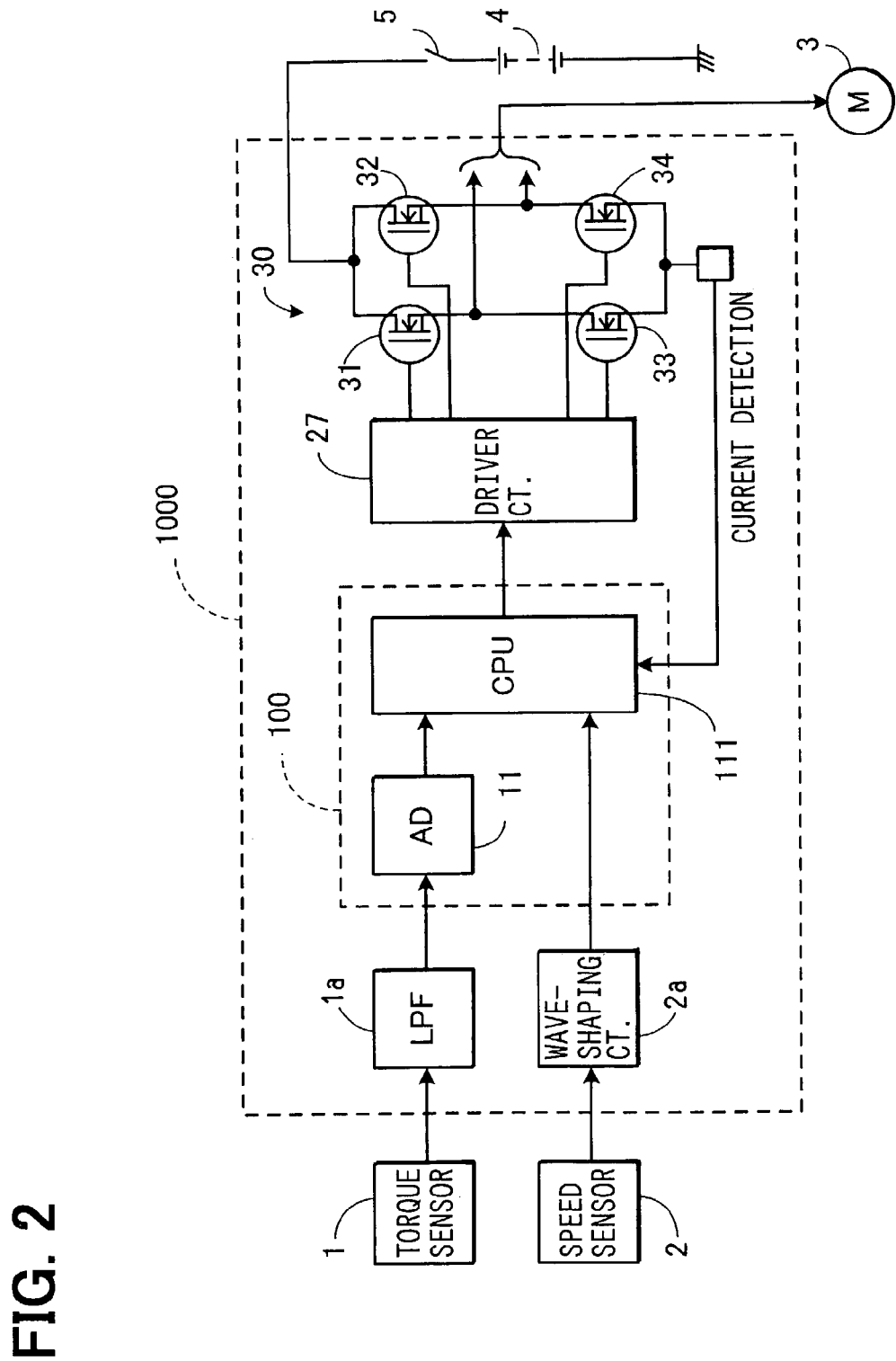
FIG. 2 is a block diagram showing an electronic control unit for controlling operation of the motor-assisted steering system.

FIG. 2 shows electrical components contained in the ECU 1000 and electrical connections therein. The ECU 1000 is composed of a low-pass filter 1a, a wave-shaping circuit 2a, a micro-computer 100, a driver circuit 27 and an H-bridge circuit 30. The micro-computer 100 includes an A-D converter 11 and a central processing unit (CPU) 111. The signals from the steering torque sensor 1 are fed to the A-D converter 11 through the low-pass filter 1a, and the signals from the vehicle speed sensor 2 are fed to the CPU 111 through the wave-shaping circuit 2a. The driver circuit 27 and the H-bridge circuit 30 are connected as shown in FIG. 2.

The H-bridge circuit 30 is composed of four switching transistors (power-MOSFETs) 31–34. A predetermined voltage is supplied to the H-bridge circuit 30 from an onboard battery 4 through a relay 5. The switching transistors 31–34 are turned on or off under a pulse-width modulation (PMW), a pulse width of which is determined by the signals fed from the steering torque sensor 1 and the vehicle speed sensor 2. Directions (polarities) of the driving current supplied to the power-assisting motor 3 are also switched by the H-bridge circuit 30 based on the steering torque signals. The driving current is supplied to the power-assisting motor 3 from the H-bridge circuit 30 in a controlled manner, and thereby the power-assisting motor 3 is driven in a required direction, generating a required torque for assisting the steering.

Figure 3:
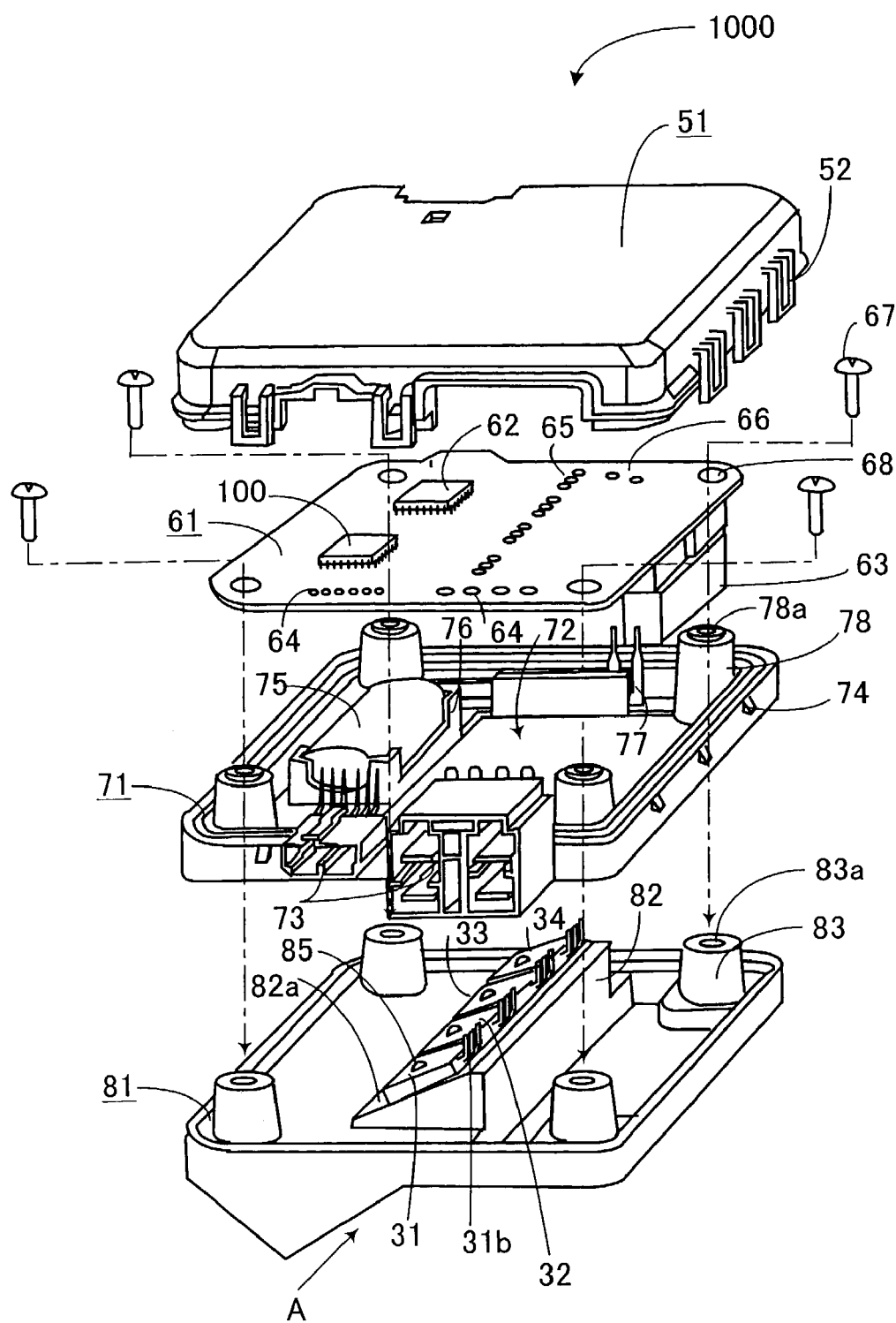
FIG. 3 is a perspective view showing a mechanical structure of the electronic control unit.

Now, referring to FIG. 3, the structure of the ECU 1000 will be described. The ECU 1000 is composed of a top cover 51, a printed circuit board 61, a case 71 and a housing 81. The top cover 51 is made of a resin material in a rectangular shape and includes snapping hooks 52 that engage with hook stoppers 74 formed on a sidewall of the case 71. The printed circuit board 61 is made of a glass-epoxy resin material, and circuits made of copper are printed thereon. Various electronic components constituting the ECU 1000 are mounted on the printed circuit board 61. On the front surface of the printed circuit board 61, the low-pass filter 1a, a wave-shaping circuit 2a, the micro-computer 100, a custom IC 62 in which principal portions of the driver circuit 27 are integrated, and other associated components are mounted. On the rear surface of the printed circuit board 61, a relay 63, and other components (not shown) such as a coil and a capacitor for absorbing noises are mounted.

The printed circuit board 61 also includes various through-holes: through-holes 64 into which leads of connectors 73 mounted on the case 71 are inserted and soldered; through-holes 65 into which connecting leads 31b–34b of switching transistors 31–34 mounted on the housing 81 are inserted and soldered; and through-holes 66 into which terminals of bus lines 77 formed in the case 71 are inserted and soldered. Screw holes 68, into which screws 67 are inserted to connect the printed circuit board 61, the case 71 and the housing 81 together, are formed at four corners of the printed circuit board 61.

The case 71 is made of resin in a rectangular shape and includes connectors 73 integrally formed by molding. A large opening 72 is formed in the case 71. The relay 63 and a coil (not shown) mounted on the printed circuit board 61 are inserted into the opening 72 from its upper side when the ECU 1000 is assembled. A heat-sink block 82 formed on the housing 81 is also inserted into the opening 72 from its lower side. The hook stoppers 74 to be engaged with the snapping hooks 52 of the top cover 51 are formed on a sidewall of the case 71. A large size capacitor 75 for smoothing a power source voltage is contained in a capacitor space 76 formed in the case 71, and the bus lines 77 are disposed in the case 71. Further, cylindrical pillars 78 each having a screw hole 78a into which the screw 67 is inserted are formed at four corners of the case 71.

The housing 81 is made of aluminum in a rectangular shape. The housing 81 serves as a heat-sink and includes a heat-sink block 82 on which the switching transistors 31–34 are mounted. The heat-sink block 82 is formed to project upwardly in a triangular shape and positioned at a substantially center portion of the housing 81. The heat-sink block 82 has a sloped surface 82a on which the switching transistors 31–34 are mounted. Cylindrical pillars 83 to be inserted into inner bores of the cylindrical pillars 78 are formed at four corners of the housing 81. The cylindrical pillar 83 includes a screw hole 83a to which the screw 67 is screwed. The switching transistors 31–34 having respective connecting leads 31b–34b are mounted on the sloped surface 82a with mounting screws 85 (shown in FIGS. 4A and 4B), so that the connecting leads 31b–34b are positioned at a top portion of the sloped surface 82a. The way of mounting the switching transistors 31–34 will be described later in further detail.

A process of assembling the ECU 1000 will be described below. The housing 81, on which the switching transistors 81–84 are mounted, is overlapped with the case 71, and the cylindrical pillars 83 of the housing 81 are inserted into inner bores of the pillars 78 of the case 71. Thus, the case 71 is correctly positioned on the housing 81. Then, the printed circuit board 61 is overlapped on the case 71 so that the screw holes 68 of the printed circuit board 61 align with the cylindrical pillars 78 of the case 71. The connecting leads 31b–34b, the terminals of the bus lines 77, and the leads of the connectors 73 are inserted into the through-holes 65, 66 and 64, respectively. Then, the printed circuit board 61, the case 71 and the housing 81 are connected together by the crews 67.

Then, all the leads inserted into the respective through-holes are electrically connected to the circuits on the printed circuit board 61 by soldering. The screws 67 are also soldered to the printed circuit board 61. The printed circuit board 61 connected to the case 71 and the housing 81 is covered with the top cover 51, and the top cover 51 is fixed to the case 71 by engaging the snapping hooks 52 with the hook stoppers 74. Thus, the process of assembling the ECU 1000 is completed.

Figure 4A:
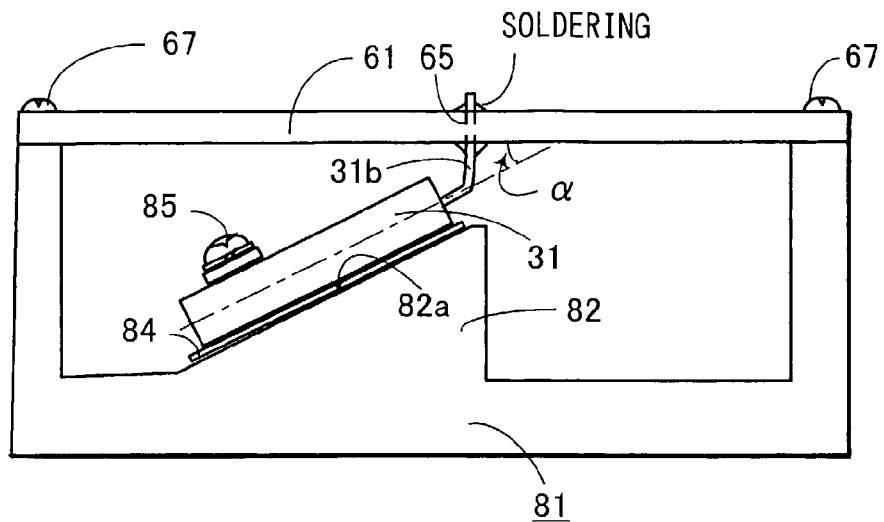
FIG. 4A is a side view showing a structure for mounting a switching transistor on a heat-sink block, viewed in direction A shown in FIG. 3.
Figure 4B:
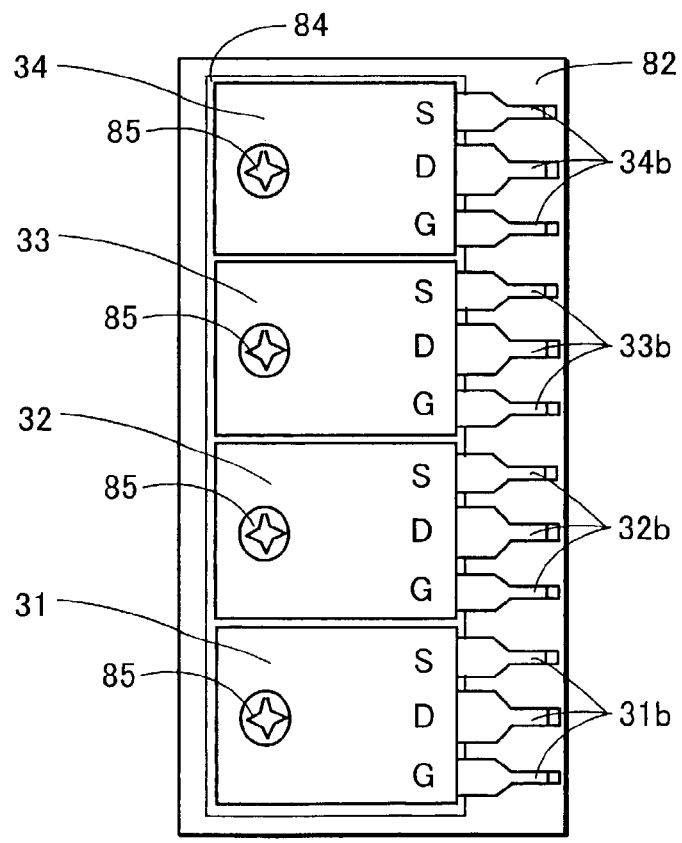
FIG. 4B is a plan view showing the switching transistors mounted on the heat-sink block.

Now, the structure of mounting the switching transistors 31–34 on the sloped surface 82a of the heat-sink block 82 will be described in detail with reference to FIGS. 4A and 4B. FIG. 4A is a side view showing the mounting structure, viewed in direction A shown in FIG. 3, and FIG. 4B is a plan view showing the switching transistors 31–34 mounted on the sloped surface 82a. In FIG. 4A, however, the case 71 is not shown to simplify the drawing.

As shown in FIG. 4A, the heat-sink block 82 is formed integrally with the housing 81 that is made of aluminum. The heat-sink block 82 is projected upwardly from a bottom plate of the housing 81 toward the printed circuit board 61 in a triangular shape. The heat-sink block 82 includes the sloped surface 82a which makes a slope angle α with respect to the printed circuit board 61. Preferably, the slope angle α is set to 30–45 degrees. The slope angle α is 30 degrees in the particular embodiment shown in FIG. 4A.

As shown in FIGS. 4A and 4B, the switching transistors 31–34 are mounted on the sloped mounting surface 82a with an insulation sheet 84 interposed therebetween. Each switching transistor 31–34 is fixed to the heat-sink block 82 with a screw 85 having a washer. The switching transistors 31–34 are mounted on the sloped mounting surface 82a, so that the respective connecting leads 31b–34b are positioned at the upper side of the sloped mounting surface 82a. As shown in FIG. 4A, each connecting lead 31b–34b is bent upwardly toward the printed circuit board 61, and inserted into the through-hole 65 and directly connected to the printed circuit board 61 by soldering.

Figure 7:
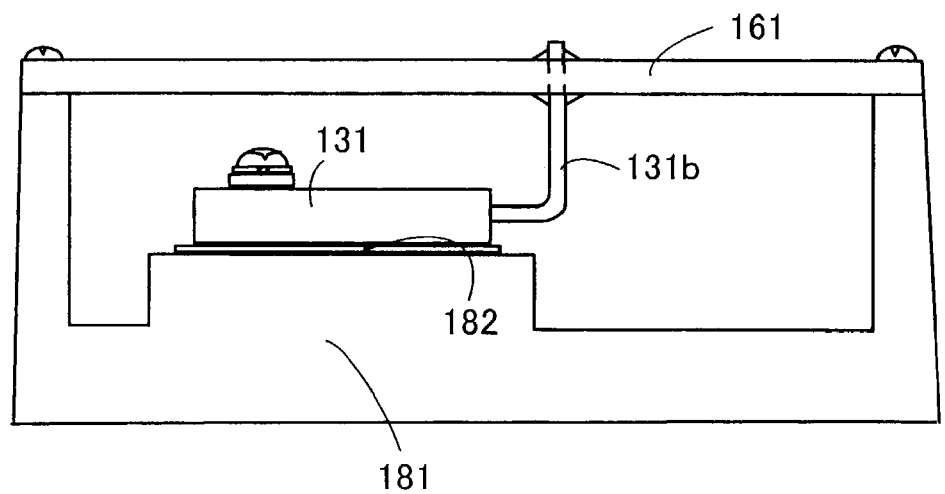
FIG. 7 is a side view showing a conventional structure for mounting a switching transistor on a flat heat-sink block.

The following advantages are realized in the switching device described above. Since the connecting leads 31b–34b of the switching transistors 31–34 are positioned close to the printed circuit board 61, the length of each connecting lead can be made short. Especially, a portion of the connecting lead narrowed for inserting it into the through-hole 65 can be made considerably short. Therefore, an electrical resistance of the connecting lead can be made low, and an amount of heat generated in the connecting lead 31b–34b can be suppressed. The length of the connecting lead 31b–34b is about one-third, compared with connecting lead 131b of the conventional switching device shown in FIG. 7.

Since the connecting leads 31b–34b are directly connected to the printed circuit board 61 without using additional connecting wires, an impedance in the wiring circuit can be suppressed at a low level, resulting in reducing noises in the wiring circuit. Since no additional wires for connecting the switching transistors 31–34 to the printed circuit board 61, the structure of the switching device is simplified and its manufacturing cost is reduced. Since multi-layer printed circuits can be formed on the printed circuit board 61, as opposed to a conventional metallic substrate, a large amount of current can be handled in the switching device having a low impedance, and therefore noises in the switching device can be reduced.

Since the heat-sink block 82 having a sufficient heat-dissipation capacity is formed integrally with the housing 81 that is exposed outside, the heat generated in the switching transistors 31–34 is effectively dissipated. Accordingly, a temperature rise in the switching transistors 31–34 is suppressed to a low level.

The heat-sink block 82 is formed at a center portion of the housing 81, as shown in FIG. 4A, and spaces at both sides of the heat-sink block 82 are utilized for accommodating other components therein. The space at the left side of the heat-sink block 82 (referring to FIG. 4A) is utilized as a space for accommodating the large-sized capacitor 75 mounted on the case 71. The right side space is utilized for accommodating the relay 63 and other components mounted on the printed circuit board 61. In this manner, spaces in the device are effectively utilized.

The housing 81, the case 71, the printed circuit board 61 and the top cover 51 are assembled by stacking up in one direction. Therefore, the process of assembling the ECU 1000 can be efficiently carried out. The case 71 is sandwiched between the printed circuit board 61 and the housing 81, and those are connected together with four screws 67. Further, those three components 61, 71, 81 are correctly and easily positioned relative to one another by inserting the cylindrical pillars 83 of the housing 81 into the pillars 78 of the case 71 and by inserting the screws 67 into holes of those pillars. Accordingly, the assembling process is further simplified.

The connecting leads 31b–34b of the switching transistors 31–34, the leads of bus lines 77 and the leads of the connectors 73 are all inserted in the same direction into the through-holes formed in the printed circuit board 61. Therefore, all the leads can be soldered to the printed circuit in a single soldering process. Further, the screws 67, which connect three components 81, 71 and 61 together, are also fixed to the printed circuit board 61 by soldering. Therefore, the screws 67 are not loosened, and the connection of three components 81, 71, 61 is firmly kept.

Figure 5:
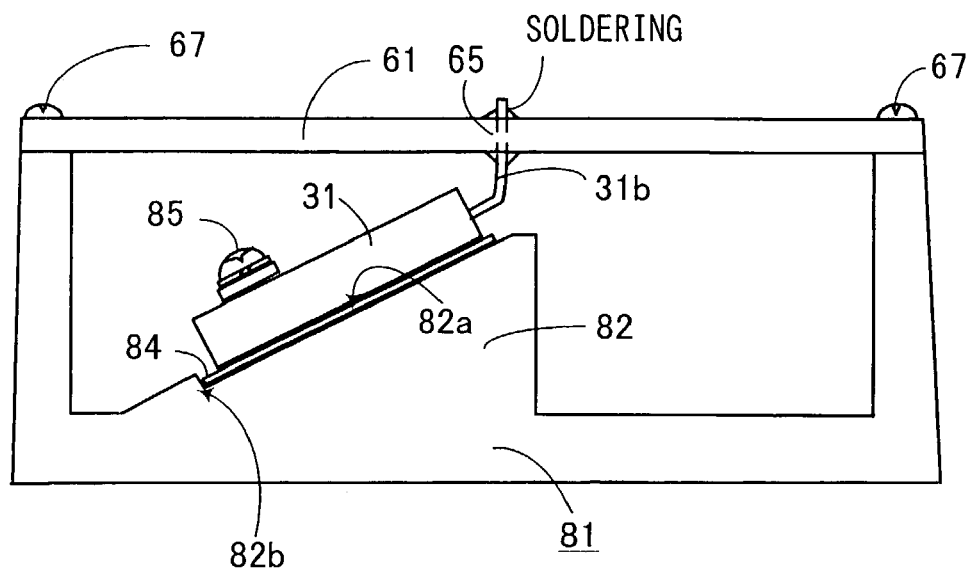
FIG. 5 is a side view showing a modified form of the mounting structure shown in FIG. 4A.

The present invention is not limited to the embodiment described above, but it may be variously modified. For example, as shown in FIG. 5, a step 84 for correctly positioning the insulation sheet 84 may be formed on the sloped surface 82a.

Figure 6A:
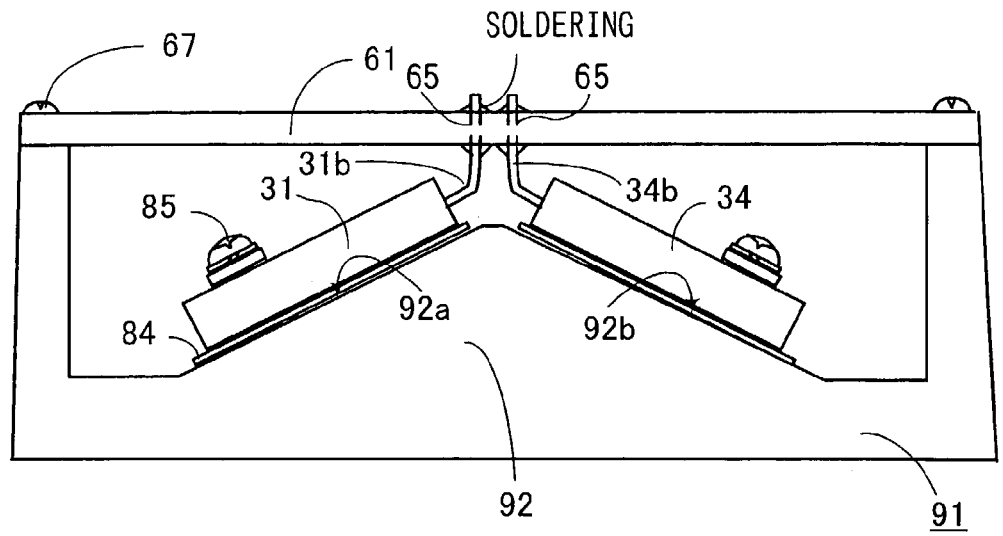
FIG. 6A is a side view showing another modified form of the mounting structure shown in FIG. 4A.
Figure 6B:
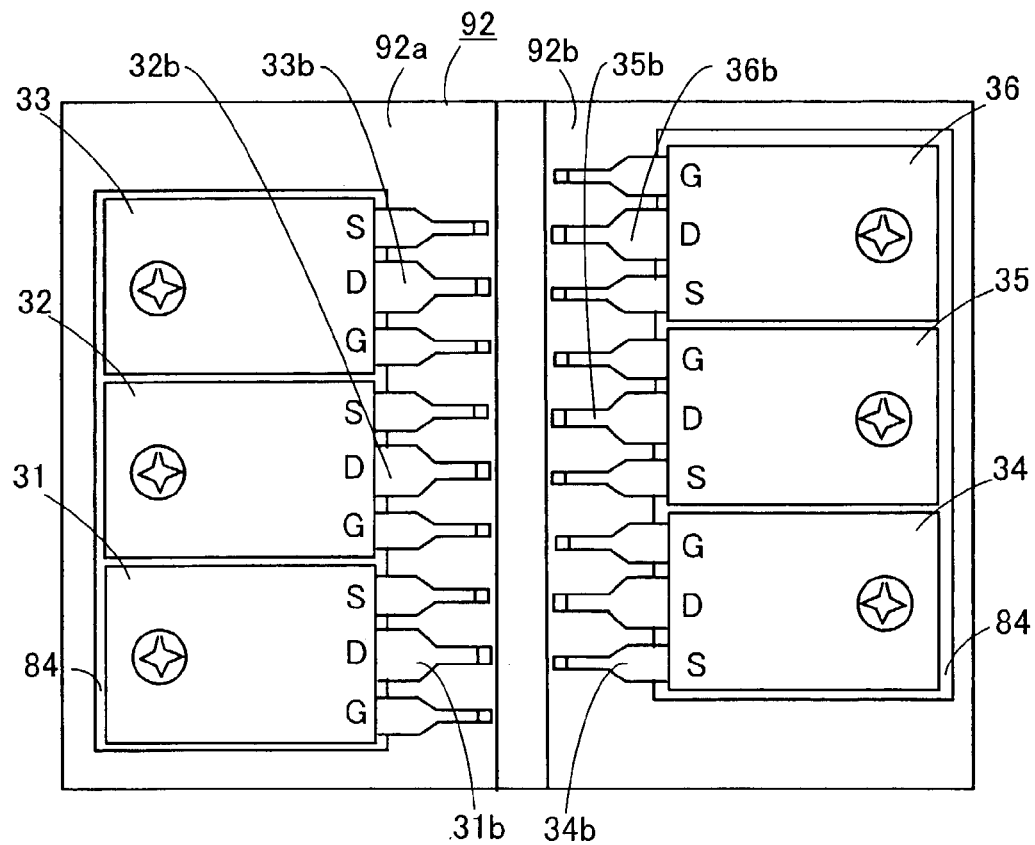
FIG. 6B is a plan view showing the mounting structure shown in FIG. 6A.

The heat-sink block 82 may be modified to a form shown in FIGS. 6A and 6B. For supplying power to a three-phase brush-less motor in a controlled manner, a bridge circuit composed of six switching transistors is required. To mount the six switching transistors 31–36 on a heat-sink block, the heat-sink block 92 having a pair of sloped mounting surfaces 92a, 92b is formed in the housing 91. A first transistor group composed of three switching transistors 31–33 is mounted on the sloped mounting surface 92a, and a second transistor group composed of the other three switching transistors 34–36 is mounted on the other sloped mounting surface 92b.

The first and the second transistor groups are mounted on the sloped mounting surfaces 92a, 92b, so that connecting leads 31b–33b of the first transistor group face connecting leads 34b–36b of the second transistor group, as shown in FIGS. 6A and 6B. Further, as shown in FIG. 6B, the connecting leads extending from drain terminals D of the first transistor group are positioned to face the connecting leads extending from source terminals S of the second transistor group, and the connecting leads extending from source terminals S of the first transistor group are positioned to face the connecting leads extending from drain terminals D of the second transistor group. For example, the connecting lead 31b extending from the drain terminal D of the switching transistor 31 is positioned to face the connecting lead 34b extending from the source terminal S of the switching transistor 34. Each drain terminal D of the first transistor group is electrically connected to each source terminal S of the second transistor group, and each source terminal S of the first transistor group is electrically connected to each drain terminal D of the second transistor, and a large amount of current flows through each lead connecting the drain terminal D and the source terminal S. It is desirable, therefore, to make an electrical resistance of the leads connecting the drain terminals D and the source terminals S as low as possible.

Since the connecting leads 31b–33b and 34b–36b are positioned as described above and shown in FIGS. 6A, 6B, the resistance in the leads connecting the drains D and the sources S can be made considerably low. In addition, the width of the connecting leads extending from the drain terminals D is made wider than that of other connecting leads. Therefore, heat generated in the connecting leads can be suppressed to a low level.

Though the switching device suitable to the motor-assisted steering device is shown as an embodiment of the present invention, the switching device according to the present invention is applicable to other devices, in which a large amount of current (e.g. 40–80 amperes) is controlled and switched. Other devices include a driver circuit for controlling operation of a compressor of an automotive air-conditioner and a device for fastening and loosening a seat belt. Though the power-MOSFETs are used as power-switching elements in the foregoing embodiment, other power-switching elements such as IGBTs may be used.

While the present invention has been shown and described with reference to the foregoing preferred embodiment and modified forms, it will be apparent to those skilled in the art that changes in form and detail may be made therein without departing from the scope of the invention as defined in the appended claims.

What is claimed is:

1. A switching device for controlling a large amount of current, the switching device comprising:
   a circuit board an which electronic components are mounted;
   a power-switching element having connecting leads extending to one side of the power-switching element, the connecting leads being directly connected to the circuit board; and
   a housing containing the power-switching element therein and being disposed underneath the circuit board, the housing including a heat-sink block having at least one sloped mounting surface rising from a bottom of the housing toward the circuit board, sloped mounting surface facing the circuit board, the power-switching element being mounted on the sloped mounting surface in close contact therewith so that the connecting leads are positioned close to the circuit board.

2. The switching device as in claim 1, wherein:
   the heat-sink block includes a pair of sloped mounting surfaces; and
   a plurality of the power-switching elements are mounted on each sloped mounting surface, so that the connecting leads of the power-switching elements mounted on one sloped mounting surface face the connecting leads of the power-switching elements mounted on the other sloped mounting surface.

3. The switching device as in claim 2, wherein:
   the connecting leads extending from drain terminal of the power-switching elements mounted on one sloped mounting surface are aligned substantially in line with the connecting leads extending from source terminals of the power-switching elements mounted on the other sloped mounting surface; and
   the connecting leads extending from source terminals of the power-switching elements mounted on one sloped mounting surface are aligned substantially in line with the connecting leads extending from drain terminals of the power-switching elements mounted on the other sloped mounting surface.

4. The switching device as in claim 1, wherein:
   the switching device further includes an insulation sheet interposed between the power-switching element and the sloped mounting surface; and
   the eloped mounting surface includes a step against which a lower fringe of the insulation sheet abuts.

5. The switching device as in claim 1, wherein:
   the switching device is for use in a motor-assisted steering device of an automotive vehicle that includes an electric motor for assisting a steering torque generated by a driver, the switching device supplying electric power to the electric motor in a controlled manner according to a required steering torque and a driving speed of the automotive vehicle.

6. A power-switching element housing comprising:
   a circuit board mounting portion; and
   a heat-sink black having at least one sloped mounting surface extending from a bottom of the housing toward the circuit board mounting portion for facing the circuit board mounting portion, wherein
   the sloped mounting surface is for enabling connecting leads of a power-switching element to be positioned close to a circuit board when a power-switching element is mounted in close contact with the sloped mounting surface and the circuit board is mounted on the circuit board mounting portion.

7. The power-switching element housing of claim 6, wherein the heat-sink block is triangular in shape.

* * * * *